(12) United States Patent
Sasaki

(10) Patent No.: US 6,413,385 B1
(45) Date of Patent: Jul. 2, 2002

(54) THIN-FILM TEMPERATURE-SENSITIVE RESISTOR MATERIAL AND PRODUCTION PROCESS THEREOF

(75) Inventor: Tokuhito Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/617,030

(22) Filed: Jul. 14, 2000

Related U.S. Application Data

(62) Division of application No. 09/081,138, filed on May 19, 1998, now Pat. No. 6,127,914.

(30) Foreign Application Priority Data

May 19, 1997 (JP) ............................................... 9-128757

(51) Int. Cl.[7] .............................................. C23C 14/34
(52) U.S. Cl. ............................. 204/192.21; 204/192.15
(58) Field of Search ...................... 204/192.21, 192.15

(56) References Cited

U.S. PATENT DOCUMENTS

| | | | | |
|---|---|---|---|---|
| 3,558,461 A | * | 1/1971 | Parisi ..................... | 204/192.21 |
| 5,367,285 A | * | 11/1994 | Swinehart et al. ..... | 204/192.21 |
| 5,450,053 A | | 9/1995 | Wood ......................... | 338/189 |
| 5,805,049 A | * | 9/1998 | Yamada et al. ............... | 338/25 |

FOREIGN PATENT DOCUMENTS

| | | |
|---|---|---|
| JP | 57-95601 | 6/1982 |
| JP | 60-253201 | 12/1985 |
| JP | 1-52882 | 11/1989 |
| JP | 4-299802 | 10/1992 |
| JP | 08-128889 | * 5/1996 |

OTHER PUBLICATIONS

Westwood, "Analysis of an Ar–O2–N2 discharge for tantalum sputtering", J. Vac. Sci. Tecnol., vol. 11, No. 1, Jan./Feb., pp. 175–178, Feb. 1974.*

Hubert Jerominek et al., "Vanadium oxide films for optical switching and detection," *Optical Engineering*, vol. 32, No. 9, Sep. 1993, pp. 2092–2099.

* cited by examiner

*Primary Examiner*—Rodney G. McDonald
(74) *Attorney, Agent, or Firm*—Sughrue Mion, PLLC

(57) ABSTRACT

Described are a thin-film temperature-sensitive resistor material which comprises, at a temperature-sensitive resistor portion, a mixed crystal of a nitride and oxide of a transition metal such as vanadium [preferably, that represented by the formula: $MN_xO_y$ wherein $0<x<1$, and $2 \leq y \leq 13/6$], simultaneously exhibits a high temperature coefficient of resistance and a low specific resistance at about room temperature, and has excellent sensitivity at about room temperature; and a process for the production of a thin-film temperature-sensitive resistor material, which comprises forming its temperature-sensitive resistor portion by using a gas-atmosphere composed mainly of a nitrogen gas [preferably, a mixed gas composed of nitrogen, argon and oxygen, and has a flow rate ratio of nitrogen to oxygen (nitrogen/oxygen) of 14/1 to 23/1].

6 Claims, 4 Drawing Sheets

US 6,413,385 B1

THIN-FILM TEMPERATURE-SENSITIVE RESISTOR MATERIAL AND PRODUCTION PROCESS THEREOF

This is a divisional of application Ser. No. 09/081,138 filed May 19, 1998 now U.S. Pat. No. 6,127,914, the disclosure of which is incorporated herein by reference.

BACKGROUND OF THE INVENTION

1. Field of the Invention

This invention relates to a thin-film temperature-sensitive resistor material used for thermometry or infrared detection and a process for producing the material.

2. Description of the Related Art

Thermometers and infrared ray sensors using a thin-film temperature-sensitive resistor material are conventionally known. FIG. 7 is a schematic view illustrating the structure of an infrared ray sensor which uses a thin-film temperature-sensitive resistor material. This sensor has a thin-film temperature-sensitive resistor material 8 between electrodes 11 on a supporting film 14. Over the material 8, a protective film 10 and an infrared absorption layer 9 are stacked, while an infrared reflective film 13 is disposed below the supporting film 14 via space 12. Infrared ray energy incident from the upper side of the drawing is converted to heat at the infrared absorption layer 9. The resulting increase of temperature causes a change in the resistance of the thin-film temperature-sensitive resistor material 8. Infrared rays can be detected by applying an electric current or voltage to the material 8 from the electrodes 11 and reading the change.

Metal oxides are mainly used as conventional thin-film temperature-sensitive resistor materials. Among them, a vanadium metal oxide (VMOx: M represents a metal and x stands for the oxidation number) which is an oxide with a transition metal vanadium (V), and another metal has been used as a material having a relatively high temperature coefficient of resistance (for example, Japanese Patent Laid-Open Nos. 253201/1985, 95601/1982 and 52882/1989).

As a conventional process for producing a thin-film temperature-sensitive resistor material, for example, a film can be formed on a substrate by carrying out sputtering with vanadium or vanadium and another metal as a target in an argon gas, followed by reaction with an argon-oxygen mixed gas. Alternatively, a film can be formed by the sol-gel processing in which a metal alcohol substance is applied to a substrate, followed by decomposition and removal of the organic residue by thermal treatment. FIG. 5 is a schematic view illustrating a process for producing a thin-film temperature-sensitive resistor material by the above-described conventional sputtering process. A desired thin-film temperature-sensitive resistor material can be formed over a substrate 5 by disposing, as illustrated in FIG. 5, the substrate 5 and target 6 in a sputtering chamber 4 equipped with gas inlet ports 1,2 and an exhaust port 7, introducing an argon gas from the gas inlet port 1 and an argon-oxygen mixed gas from the gas inlet port 2, and sputtering the target 6.

The performance of the thin-film temperature-sensitive resistor material is expressed by a temperature coefficient of resistance α (%/K) which is a resistance change rate per degree of a temperature change. FIG. 6 is a graph illustrating temperature characteristics of the resistance of the conventional thin-film temperature-sensitive resistor material composed of vanadium oxide, said material having been formed by sputtering vanadium in an argon-oxygen mixed gas. Temperature characteristics of the resistance of such a thin-film temperature-sensitive resistor material are also shown in FIGS. 1 and 2 on page 3 of Japanese Patent Laid-Open No. 253201/1985 or Jerominek, et al., Optical Engineering, 32, 2094 (1993), FIG. 1.

When used for the thermometry or infrared detection at the temperature (20 to 30° C.) near room temperature, a thin-film temperature-sensitive resistor material is required to exhibit a high temperature coefficient of resistance around the room temperature. The thin-film temperature-sensitive resistor material as described above has, as shown in FIG. 6, a temperature coefficient of resistance as low as −2%/K at about room temperature and is therefore insufficient in sensitivity.

When a material has a high temperature coefficient of resistance at about room temperature, more specifically, when the material has a temperature coefficient of resistance higher than −2%/K at about room temperature as shown in Jerominek et al, Optical Engineering, 32, 2094(1993), FIG. 1, the specific resistance value of the material also becomes high, exceeding 0.1 Ωcm. Since it is generally impossible to form the thin-film temperature-sensitive material thicker than 1000 Å, a high specific resistance value means nothing but a high resistance. The noise level generated in the material also becomes high. As a result, if the temperature coefficient of resistance at about room temperature is increased, the noise level is inevitably increased so that the sensitivity can not be improved.

As described above, it is difficult for the conventional thin-film temperature-sensitive resistor material composed of a metal oxide to simultaneously satisfy both the requirements for an increase in the temperature coefficient and lowering in the specific resistance value.

SUMMARY OF THE INVENTION

The present invention has been made with a view to overcoming the above-described problems of the prior art. An object of the present invention is to provide a thin-film temperature-sensitive resistor material which exhibits a high temperature coefficient of resistance at about room temperature (20 to 30° C.) and a low specific resistance, and has excellent sensitivity at about room temperature; and a process for producing the material.

In one aspect of the present invention, there is thus provided a thin-film temperature-sensitive resistor material, which comprises, at a temperature-sensitive resistor portion thereof, a mixed crystal of a nitride and oxide of a transition-metal.

In another aspect of the present invention, there is also provided a process for producing the above-described thin-film temperature-sensitive resistor material, which comprises sputtering a transition metal target in a gas-atmosphere composed mainly of a nitrogen gas to form a mixed crystal of a nitride and oxide of a transition metal.

The present invention makes use of the properties that a transition metal oxide has both metallic and non-metallic properties and these properties separate into respective ones at a specific temperature as a border line; the electric properties of a metal nitride are easily controllable by a nitrogen content; a transition metal can be readily in the form of a mixed crystal of its oxide and nitride.

The transition temperature of a transition metal oxide from a metal to a non-metal is generally determined by the valence number of oxygen bound with the metal. In the present invention, this transition metal is in the form of a mixed crystal with a nitride which makes it possible to change the transition temperature more minutely according to a nitrogen/oxygen ratio bound with the metal. As a result, a thin-film temperature-sensitive resistor material which can simultaneously satisfy a high temperature coefficient of resistance and a low specific resistance at about room temperature is available.

Accordingly, the thin-film temperature-sensitive resistor material of the present invention simultaneously shows a high temperature coefficient of resistance and a low specific resistance value at about room temperature so that it is excellent in the sensitivity at about room temperature and is therefore very useful for the. applications such as infrared ray sensor and temperature detector each used at about room temperature.

Furthermore, according to the process of the present invention, such excellent thin-film temperature-sensitive resistor material can be easily and favorably produced.

The above and other objects, features and advantages of the present invention will become apparent from the following description with reference to the accompanying drawings which illustrate preferred embodiments and examples of the present invention.

DESCRIPTION OF THE PREFERRED EMBODIMENTS

The thin-film temperature-sensitive resistor material of the present invention is formed, at its temperature-sensitive resistor portion, of a mixed crystal of a nitride and oxide of a transition metal. As the transition metal; vanadium is preferred. In addition, transition metals usable as a material for a transition metal oxide which is transitional between a metal and non-metal, for example, chromium, manganese, iron and cobalt can be employed. The mixed crystal of the nitride and oxide of a transition metal is preferred to have a composition represented by the following formula: $MN_xO_y$ (M represents a transition metal) in which $0<x<1$, and $2 \leq y \leq 13/6$. The film thickness of the thin-film temperature-sensitive resistor material may be determined as desired according to the application or the like, but about 100 to 1000 Å is preferred.

The mixed crystal $MN_xO_y$ has an oxide-like composition, but since it is a mixture with a nitride, oxidation or reduction hardly proceeds. It is however preferred to protect the temperature-sensitive resistor portion with a silicon nitride film, thereby favorably preventing the properties of the material from changing with the passage of time. The protective film can be formed using a $SiH_4$ gas, $NH_3$ gas or nitrogen gas, for example, by the plasma chemical vapor phase deposition method.

The thin-film temperature-sensitive resistor material according to the present invention can be produced easily and favorably by the high-frequency sputtering method in which a transition metal target is sputtered in a gas-atmosphere composed mainly of a nitrogen gas to form a mixed crystal of the nitride and oxide of a transition metal.

Figure 1:
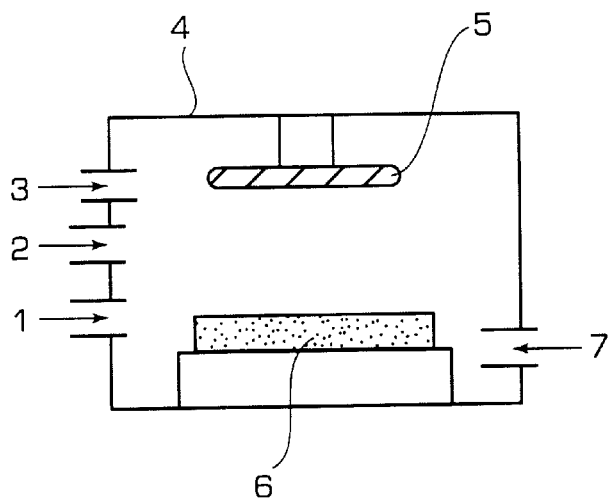
FIG. 1 is a schematic view illustrating a production process of a thin-film temperature-sensitive resistor material of the present invention.
Figure 5:
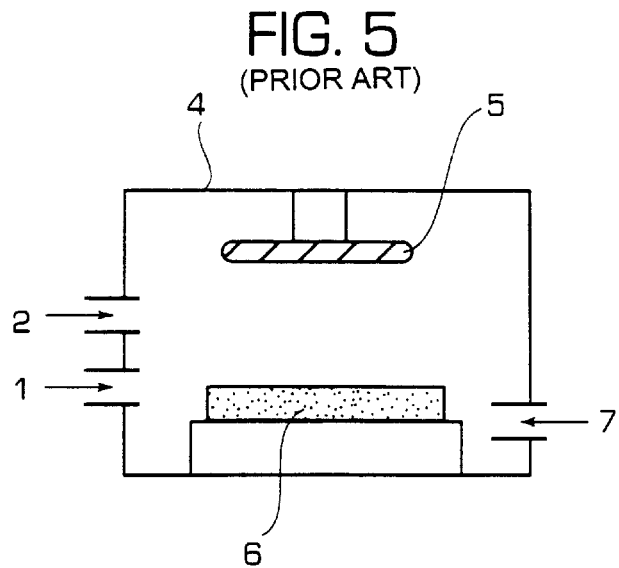
FIG. 5 is a schematic view illustrating a production process of the conventional thin-film temperature-sensitive resistor material.
Figure 6:
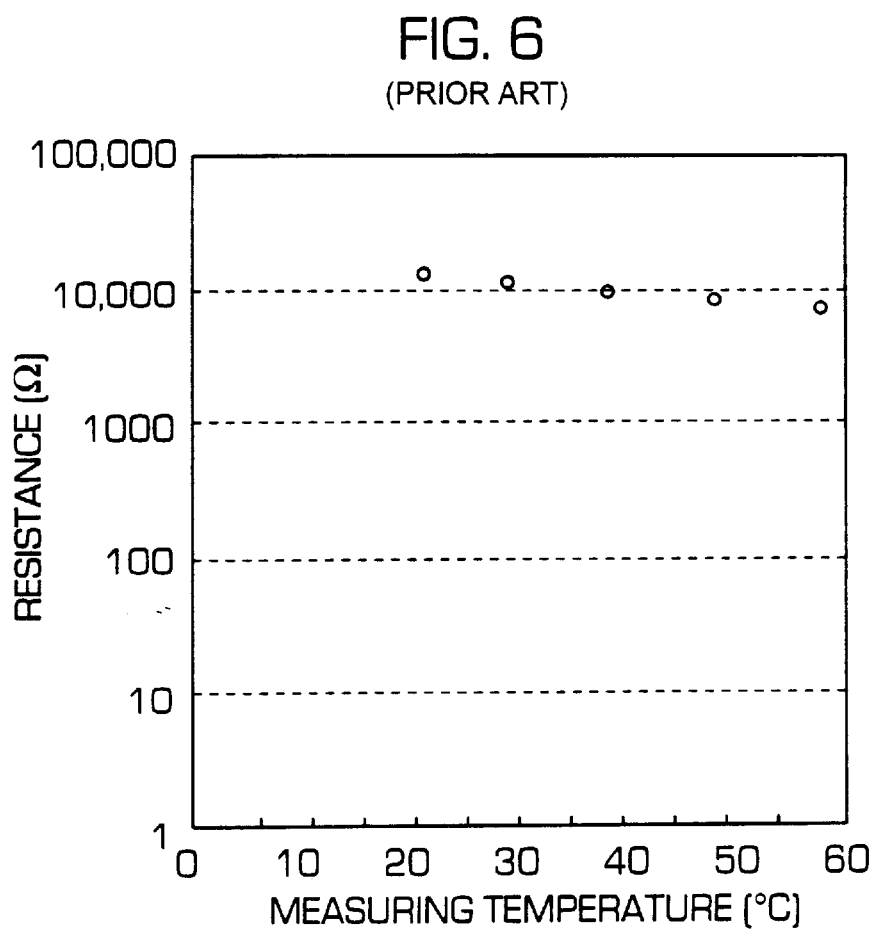
FIG. 6 is a graph illustrating temperature characteristics of the resistance of the conventional thin-film temperature-sensitive resistor material.

FIG. 1 is a schematic view illustrating a process for producing the thin-film temperature-sensitive resistor material of the present invention by the high-frequency sputtering method. The apparatus shown in FIG. 1 has a similar structure to that shown in FIG. 5 except that a gas inlet port 3 is disposed for the introduction of a nitrogen gas.

For example, a vanadium oxynitride film can be formed on a substrate 5 by disposing the substrate 5 and a target 6 in a sputtering chamber 4 as shown in FIG. 1, evacuating the sputtering chamber 4, heating the substrate 5, introducing an argon gas from a gas inlet port 1, an argon-oxygen mixed gas from a gas inlet port 2 and a nitrogen gas from a gas inlet port 3, respectively, and starting discharge to effect sputtering of the target 6. The deposition rate can be controlled by an inputted power, a distance between the substrate 5 and the target 6, or the like.

The sputtering gas is preferably a mixed gas of nitrogen, argon and oxygen as described above. It is more preferred that the flow rate ratio of nitrogen to oxygen (nitrogen/oxygen) falls within a range of from 14/1 to 23/1. The argon gas only contributes to the sputtering of the target 6. Since it hardly composes the film, it does not have an influence on the nitrogen/oxygen ratio, which is a compositional ratio of the film. Accordingly, the compositional ratio of the film is determined by the flow rate ratio of nitrogen to oxygen. The oxygen content in the argon-oxygen gas mixture may be determined as needed depending on the nitrogen concentration (nitrogen gas flow rate) in the whole gas-atmosphere.

Incidentally, it is difficult to add oxygen to the film by only introducing an oxygen gas into the film, because the sputter particles have already been nitrided. It is preferred to sputter vanadium in an inactive argon gas-mixed with oxygen as described above, which makes it possible to add oxygen to vanadium nitride smoothly.

Other sputtering conditions may be determined as needed depending on the performance required for the resulting film. For example, a sputtering pressure, which will have an influence on the temperature coefficient of resistance or a specific resistance of the film, is preferably controlled to about 4 to 30 mTorr.

It is also preferred to carry out preliminary sputtering of the target 6 for a proper time prior to the above-described sputtering.

The present invention will hereinafter be described more specifically by examples.

<Examples 1–4>

As shown in FIG. 1, disposed in a sputtering chamber 4 were a vanadium metal as a target 6 and a silicon substrate as a substrate 5. After evacuation of the sputtering chamber 4 to $10^{-6}$ Torr or less, the substrate 5 was heated to about 300° C. and as a sputtering gas, an argon gas, an argon-oxygen gas mixture (oxygen content: 20%) and a nitrogen gas were introduced from a gas inlet port 1, a gas inlet port 2 and a gas inlet port 3, respectively.

Those gases were introduced simultaneously into the sputtering chamber 4 and discharge was started, whereby the surface of the target 6 was subjected to preliminary sputtering for 30 minutes. Then, the formation of a vanadium oxynitride film on the substrate 5 was started. The film-forming conditions in each example are shown in Table 1. In particular, the ratio of a gas flow rate (nitrogen/argon/oxygen) was changed within a range of from 14/4/1 to 23/4/1 by changing the flow rate of nitrogen.

Figure 2:
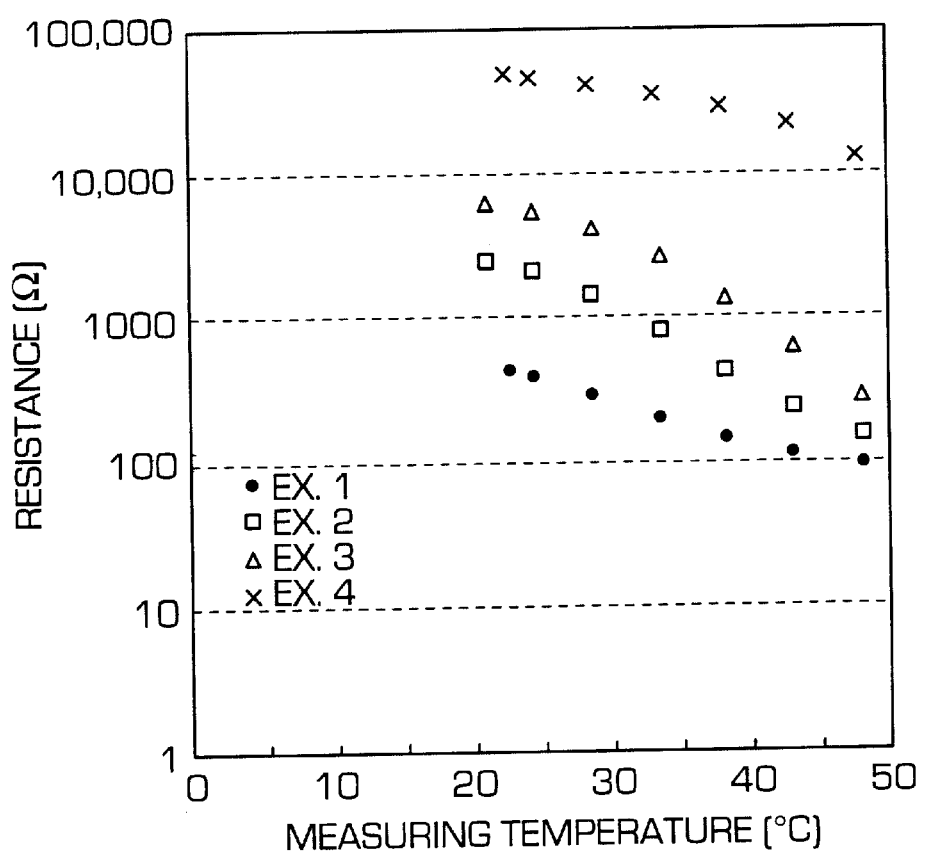
FIG. 2 is a graph illustrating temperature characteristics of the resistance of each of the thin-film temperature-sensitive resistor materials obtained in Examples 1 to 4.

To the vanadium oxynitride film having a thickness of 1000 Å thus produced, electrodes were attached, whereby temperature characteristics of the resistance were measured. The resistance at the measuring temperature in each of Examples is shown in Tables 2 to 5. FIG. 2, in which measuring results are summarized, is a graph illustrating temperature characteristics of the resistance of a thin-film temperature-sensitive resistor material of each Example composed of a vanadium oxynitride film. Table 6 shows a temperature coefficient of the resistance of the thin-film temperature-sensitive resistor material obtained in each Example.

A vanadium oxide film used for the conventional thin-film temperature-sensitive resistor material has a specific resistance at 25° C. of about 0.1 Ωcm and a temperature coefficient of resistance of −2.3%/K. The thin-film temperature-sensitive resistor materials, which had been obtained in Examples 1 to 4 and were composed of a vanadium oxynitride film, had a specific resistance at 25° C. as small as 0.026 to 0.077 Ωcm, showed a markedly large temperature change of resistance at about room temperature as shown in FIG. 2, and had a temperature coefficient as high as −3.9 to −7.2%/K as shown in Table 6. In short, the thin-film temperature-sensitive resistor materials obtained in Examples 1 to 4 had a good sensitivity at least twice as high as that of the conventional one at about room temperature.

Figure 3:
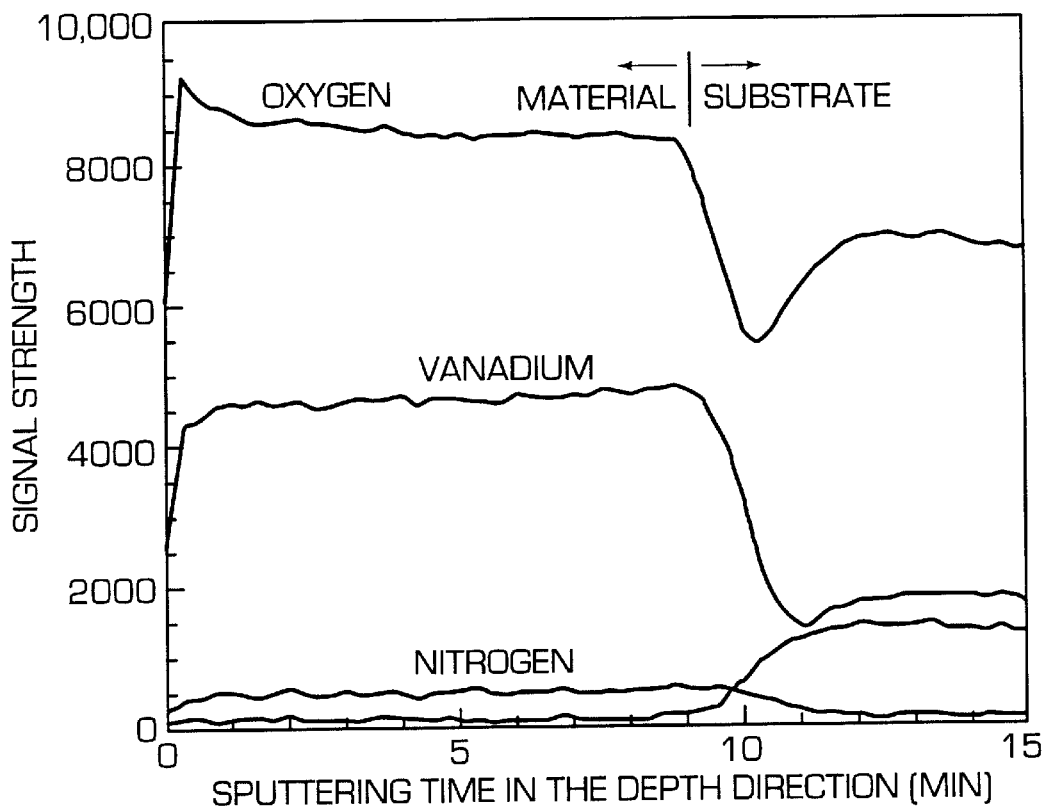
FIG. 3 is a graph illustrating the composition distribution of the thin-film temperature-sensitive resistor material of Example 1 in the film-thickness direction by Auger electron spectroscopy.

Next, the composition of the thin-film temperature-sensitive resistor material obtained in Example 1, which material was composed of a vanadium oxynitride film, in the film thickness direction was evaluated by Auger electron spectroscopy. FIG. 3 is a graph illustrating the compositional distribution of the material in the film thickness direction. The film had a composition of $VN_xO_y$ wherein $0<x<1$ and $y=2$. The thin-film temperature-sensitive resistor materials obtained in Examples 2 to 4 showed almost the same measuring results, because their flow rate ratios were the same in the number of figures with that of Example 1.

Figure 4:
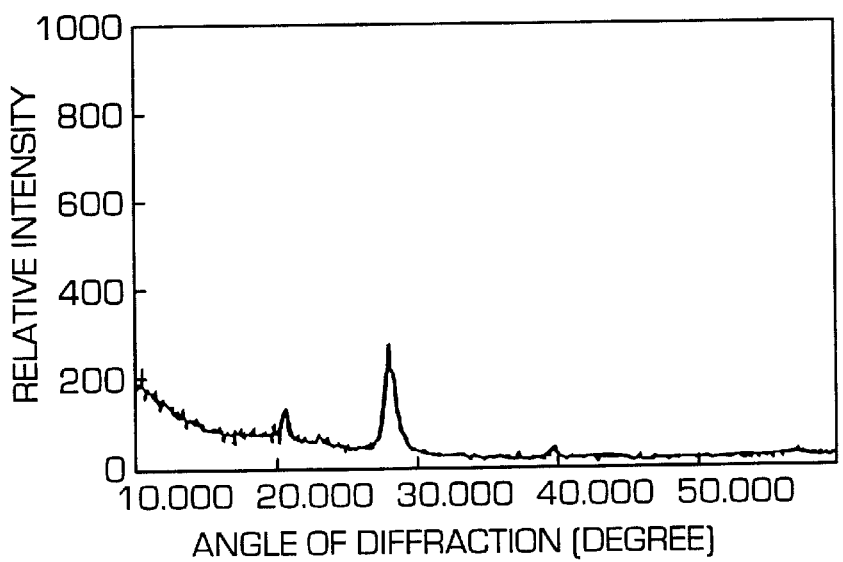
FIG. 4 is a graph illustrating an X-ray diffraction of the thin-film temperature-sensitive resistor material of Example 1.

In addition, the crystallinity of the thin-film temperature-sensitive resistor material of Example 1 composed of a vanadium oxynitride film was studied by X-ray diffraction. FIG. 4 is a graph illustrating its X-ray diffraction. From the peaks, it has been found that nitrogen was contained in $VO_2$ to $V_6O_{13}$. Accordingly, the material has a composition falling within a range of $0<x$ (nitrogen)$<1$ and $2 \leq y$ (oxygen) $\leq 13/6$.

Figure 7:
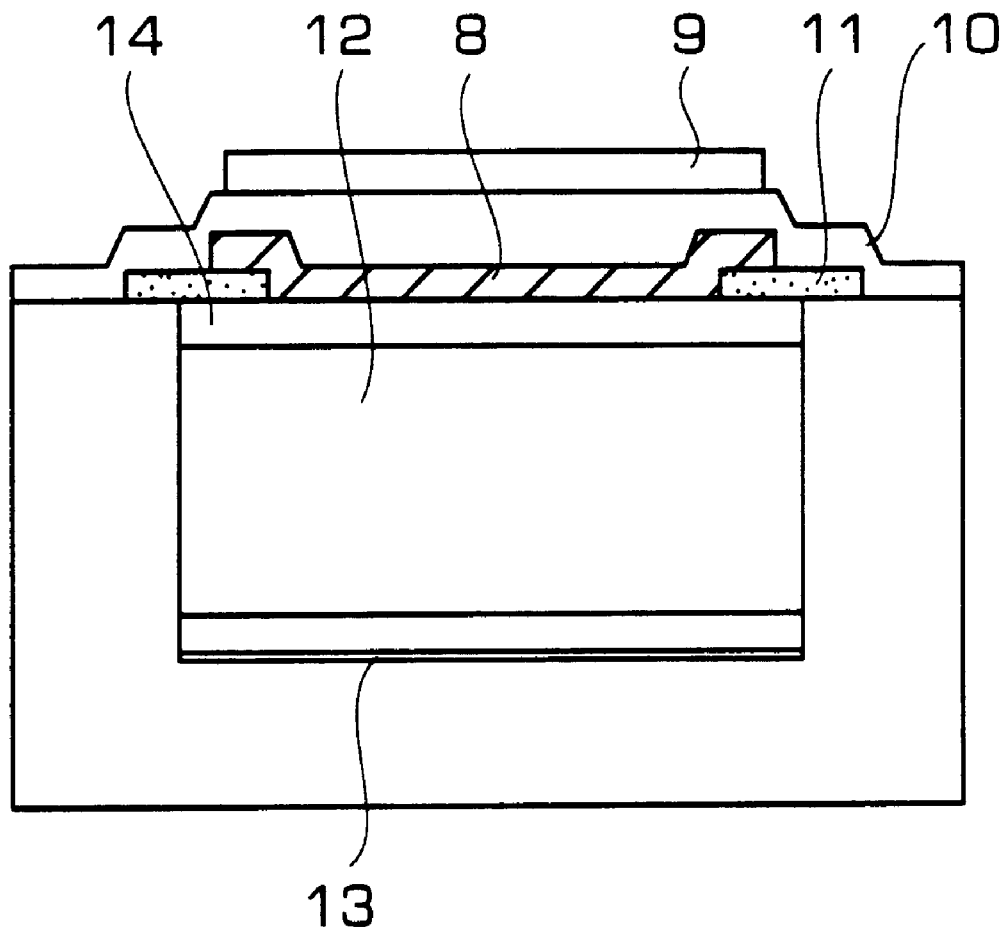
FIG. 7 is a schematic view illustrating the structure of an infrared ray sensor for which a thin-film temperature-sensitive resistor material has been used.

Then, a protective film 10 (FIG. 7) which was a silicon nitride film and had a film thickness of 3000 Å was formed over the thin-film temperature-sensitive resistor material by using $SiH_4$ and $NH_3$ gases at a substrate temperature of 250° C. and pressure of 100 pa in accordance with the plasma chemical vapor deposition method. The formation of the protective film 10 has made it possible to favorably prevent a time-dependent change in the properties of the thin-film temperature-sensitive resistor material.

While preferred embodiments and examples of the present invention have been described using specific terms, such description is for illustrative purpose only, and it is to be understood that changes and variations may be made without departing from the spirit or scope of the following claims.

TABLE 1

| | Sputtering pressure (mTorr) | Flow rate of nitrogen (sccm) | Flow rate of argon & oxygen (sccm) | Oxygen/ nitrogen flow rate ratio | RF input (W) | Sputtering time (min) |
|---|---|---|---|---|---|---|
| Ex. 1 | 16 | 22 | 4.8 | 0.044 | 500 | 80 |
| Ex. 2 | 16 | 13 | 4.8 | 0.074 | 500 | 95 |
| Ex. 3 | 16 | 18 | 4.8 | 0.053 | 500 | 95 |
| Ex. 4 | 16 | 20 | 4.8 | 0.048 | 500 | 95 |

TABLE 2

| Ex. 1: Measuring temperature (° C.) | Resistance (Ω) |
|---|---|
| 22.5 | 425.5 |
| 24.24 | 387.5 |
| 28.48 | 289.9 |
| 33.31 | 199.4 |
| 38.25 | 141.8 |
| 43.19 | 109.8 |
| 43.17 | 92.9 |

TABLE 3

| Ex. 2: Measuring temperature (° C.) | Resistance (Ω) |
|---|---|
| 20.91 | 2485.4 |
| 24.27 | 2058.4 |
| 28.66 | 1421.2 |
| 33.49 | 798.4 |
| 38.37 | 416.3 |
| 43.29 | 231.5 |
| 48.25 | 147.3 |

TABLE 4

| Ex. 3: Measuring temperature (° C.) | Resistance (Ω) |
|---|---|
| 20.91 | 6085.3 |
| 24.27 | 5277.5 |
| 28.66 | 4025.9 |
| 33.49 | 2498.3 |
| 38.37 | 1306.9 |
| 43.29 | 605.7 |
| 48.25 | 277.6 |

TABLE 5

| Ex. 4: Measuring temperature (° C.) | Resistance (Ω) |
|---|---|
| 22.26 | 48778 |
| 24.18 | 46554 |
| 28.32 | 41183 |
| 33.16 | 35410 |
| 38.1 | 29128 |
| 43.04 | 21601 |
| 48.0 | 12458 |

TABLE 6

| | Temperature coefficient at 25° C. (%/K) |
|---|---|
| Example 1 | −6.5 |
| Example 2 | −7.2 |
| Example 3 | −5.3 |
| Example 4 | −3.9 |
| Conventional Example | −2.3 |

What is claimed is:

1. A process for producing a thin-film temperature-sensitive resistor material, which process comprises sputtering a transition metal target in a gas atmosphere composed mainly of nitrogen gas to form a mixed crystal of a transition metal oxynitride, wherein the gas atmosphere is a mixed gas of nitrogen, argon and oxygen, and a flow rate ratio of nitrogen to oxygen, expressed as nitrogen/oxygen, falls within a range of from 14/1 to 23/1, wherein the mixed crystal of the transition metal oxide comprises a mixed crystal of vanadium oxynitride which has a temperature coefficient of −3.9 to −7.2%/K, wherein said mixed crystal has a composition represented by the following formula: $MN_xO_y$, wherein M represents vanadium and wherein $0<x<1$, and $2 \leq y \leq 13/6$.

2. A process according to claim 1, wherein said transition metal target is subjected to preliminary sputtering in a mixed gas of nitrogen, argon and oxygen.

3. A process according to claim 1, wherein a film of the mixed crystal of vanadium oxynitride is formed on a substrate and a protective silicon nitride film is formed on the film of the mixed crystal of the vanadium oxynitride.

4. A process according to claim 1, wherein the mixed crystal of a transition metal oxynitride is a film and has a thickness of about 100 A to about 1000 A.

5. A process according to claim 1, wherein the process is conducted at a sputtering pressure of about 4 to 30 mTorr.

6. A process according to claim 1, which comprises the steps of heating a substrate, forming the gas atmosphere which comprises nitrogen, argon and oxygen and then initiating discharge to effect the sputtering of the substrate, wherein the sputtering is a high-frequency sputtering.

* * * * *